United States Patent [19]

Oono et al.

[11] Patent Number: 5,761,230
[45] Date of Patent: Jun. 2, 1998

[54] LASER-DIODE DRIVING CIRCUIT WITH TEMPERATURE COMPENSATION

[75] Inventors: Hiroshi Oono; Masaaki Yokomizo, both of Tokyo, Japan

[73] Assignee: NEC Corporation, Tokyo, Japan

[21] Appl. No.: 651,746

[22] Filed: May 22, 1996

[30] Foreign Application Priority Data

May 22, 1995 [JP] Japan ................... 7-122182

[51] Int. Cl.$^6$ ...................................................... H01S 3/00
[52] U.S. Cl. .................. 372/38; 372/29; 372/34
[58] Field of Search .................. 372/29, 31, 32, 372/38, 34, 109

[56] References Cited

U.S. PATENT DOCUMENTS

| | | | |
|---|---|---|---|
| 4,243,952 | 1/1981 | Patterson | 372/34 X |
| 4,639,924 | 1/1987 | Tsunekawa | 372/33 |
| 4,695,714 | 9/1987 | Kimizuka et al. | 250/205 |
| 4,710,631 | 12/1987 | Aotsuka et al. | 250/354.1 |
| 4,761,659 | 8/1988 | Negishi | 346/108 |
| 4,792,957 | 12/1988 | Kollanyi | 372/34 |
| 4,884,280 | 11/1989 | Kinoshita | 372/38 |
| 5,313,482 | 5/1994 | Zelenka et al. | 372/38 |
| 5,479,425 | 12/1995 | Tegge | 372/29 X |
| 5,499,258 | 3/1996 | Kawano et al. | 372/34 |

FOREIGN PATENT DOCUMENTS

| | | | |
|---|---|---|---|
| 60-254783 | 12/1985 | Japan | 372/38 X |
| 3-145171 | 6/1991 | Japan | 372/38 X |

OTHER PUBLICATIONS

"Instrumentation for the Stable Operation of Laser Diodes," by C.C. Bradley et al., 8127, *Review of Scientific Instruments*, 61 (1990) Aug., No. 8, New York, U.S.

*Patent Abstracts Of Japan*, vol. 10, No. 121 (E–401) (2178).

*Primary Examiner*—Brian Healy
*Attorney, Agent, or Firm*—Sughrue, Mion, Zinn, Macpeak & Seas, PLLC

[57] ABSTRACT

A laser-diode driving circuit that ensures that the optical output of a laser diode will be stable within a wide temperature range. This circuit includes a reference voltage generator for generating a reference voltage, a control voltage generator for generating a control voltage, an amplifier for producing an amplified output signal corresponding to the difference between the reference voltage and the control voltage, and a driving current generator for generating a driving or operating current for driving a laser diode. The driving current generator is driven by the amplified output signal. The control voltage has a temperature dependence approximately the same as that required for keeping an optical output of the laser diode at a specified level independent of the ambient temperature change. Preferably, the control voltage generator contains a p-n junction diode for producing a temperature-dependent voltage, and a thermistor for compensating the temperature-dependent voltage to thereby produce said control voltage having an exponential characteristic with respect to the ambient temperature.

8 Claims, 5 Drawing Sheets

LASER-DIODE DRIVING CIRCUIT WITH TEMPERATURE COMPENSATION

BACKGROUND OF THE INVENTION

1. Field of the Invention

The present invention relates to a laser-diode driving circuit and more particularly, to a laser-diode driving circuit that keeps an optical output power of a laser diode (LD) at a specified level independent of the ambient temperature change.

2. Description of the Prior Art

With an optical network including a base station and a plurality of local stations, the plurality of local stations often require the base station to transmit data thereto in a burst. This data is referred to as the "burst data", because it is transmitted abruptly and immediately after a period of no data transmission.

To accurately transmit the first bit of the required burst data to the last bit of data to the corresponding local stations, an optical transmitter of the base station needs to produce an optical output signal whose level fluctuates within a specified narrow range in response to the first to last bits of the burst data. Further, the optical output level is required to be stable with respect to the ambient temperature change.

Typically, the optical transmitter has a laser diode driven by an electric, current as a light source. In this case, it has been known that the automatic power control (APC) loop circuit can compensate the temperature fluctuation of the optical output of the laser diode. In other words, this conventional APC loop circuit enables to restrain the optical output level fluctuation to be restrained due to the temperature change within a narrow range.

In the APC loop circuit, a pulsed, constant current and a non-pulsed, variable bias current are supplied to the laser diode at its driving current. The variable bias current is controlled so that the optical output power of the laser diode is kept at a specified level.

However, because of the restriction or limitation caused by the time constant of the APC loop, it is difficult for the laser diode to emit the optical output with a pre-designed level in response to the first bit of the burst data. Therefore, any temperature compensation technique other than the APC loop circuit has been required for the optical transmitter to cope with the burst data transmission.

An improved temperature compensation technique has been developed, in which the driving current of the laser diode is increased or decreased according to the ambient temperature by the use of a temperature detector, thereby keeping the optical output power at a constant level. An example of the conventional laser-diode driving circuit using this improved technique is shown in FIG. 1.

In FIG. 1, a pair of npn-bipolar transistors 102 and 103 whose emitters are coupled together constitute a differential amplifier. A base of the transistor 102 is connected to an input terminal 131 of this circuit. A base of the transistor 103 is connected to another input terminal 132 of this circuit.

A collector of the transistor 102 is connected to an anode of a laser diode 101. A cathode of the laser diode 101 is connected to a positive power supply 118. In other words, the collector of the transistor 102 is connected to the power supply 118 through the laser diode 101. A collector of the transistor 103 is directly connected to the power supply 118.

A pulsed input signal is differentially applied across the two input terminals 131 and 132 and then, is differentially amplified by the differential amplifier including the transistors 102 and 103. One of the transistors 102 and 103 is turned ON and the other is kept OFF according to the polarity of the applied input signal. A driving current $I_{OP}$ flows through one of the transistors 102 and 103 held in the ON state.

When the transistor 102 is in the ON state, the driving current $I_{OP}$ flow through the laser diode 101 and the transistor 102 and therefore, the laser diode 101 emits output light 123. The output light 123 has an optical intensity and a duration corresponding to those of the input signal. When the transistor 103 is in the ON state, the driving current $I_{OP}$ flows through the transistor 103 and therefore, no output light is emitted from the laser diode 101.

A bipolar transistor 105 has a collector connected to the coupled emitters of the transistors 102 and 103 at a point 104, an emitter connected to one end of a resistor 109, and a base connected to an output terminal 119 of an operational amplifier 106. The other end of the resistor 109 is grounded. The transistor 105 is supplied with an amplified output signal current from the operational amplifier 106 at its base, thereby producing the driving current $I_{OP}$ at its collector. The resistor 109 is used for degenerating the current flowing through the transistor 105.

The operational amplifier 106 has a non-inverted input terminal 120 and an inverted input terminal 121 A reference voltage $V_{REF}$ is applied to the non-inverted input terminal 120. A temperature-dependent voltage $V_T$ is applied to the inverted input terminal 121. The operational amplifier 106 differentially amplifies the difference between the reference voltage $V_{REF}$ and the temperature-dependent voltage $V_T$ with a fixed, specified gain to input the amplified output signal current to the base of the transistor 105. The transistor 105 is driven by the amplified output signal current, thereby generating the driving current $I_{OP}$ flowing through the transistor 105.

Two serially connected resistors 111 and 112 are provided for producing the reference voltage $V_{REF}$ between a positive power supply 122 and the ground. The reference voltage $V_{REF}$ is produced by dividing a positive supply voltage of the power supply 122 with the resistance ratio of the resistors 111 and 112 at a connection point 114 of the resistors 111 and 112. The point 114 is connected to the non-inverted input terminal 120 of the operational amplifier 106. The reference voltage $V_{REF}$ is inputted into the amplifier 106 through the non-inverted input terminal 120.

A resistor 110 and a p-n junction diode 113 are provided for producing the temperature-dependent voltage $V_T$ between the positive power supply 122 and the ground. The p-n junction diode 113 has an anode connected to the ground and a cathode connected to one end of the resistor 110. The other end of the resistor 110 is connected to the power supply 122. A connection point 115 of the resistor 110 and the p-n junction diode 113 is connected to the inverted input terminal 121 of the operational amplifier 106. The resistor 110 serves to restrict a bias current flowing through the diode 113.

The forward voltage drop of the p-n junction diode 113 varies dependent upon the ambient temperature and therefore, this diode 113 is capable of the ambient temperature detection. The temperature-dependent voltage $V_T$ is produced by dividing the positive supply voltage of the power supply 122 with the voltage drop ratio caused by the resistor 110 and the diode 113 at the point 115. The temperature-dependent voltage $V_T$ thus produced is inputted into the operational amplifier 106 through the inverted input terminal 121 and a resistor 116. This resistor 116 serves to restrain an input current to the terminal 121.

A resistor 108 is connected between the emitter of the transistor 105 and the inverted input terminal 121 of the amplifier 106. A part of the current flowing through the transistor 105 is fed back to the amplifier 106 through resistor 108 and the input terminal 121 in negative phase. The resistor 108 serves to restrain the negative feedback current of the amplifier 106.

With the conventional laser-diode driving circuit of FIG. 1, the temperature-dependent voltage $V_T$ corresponding to the ambient temperature and the reference voltage $V_{REF}$ are inputted into the operational amplifier 106 through its inverted and non-inverted input terminals 121 and 120, respectively, thereby driving the transistor 105. This means that the driving current $I_{OP}$ flowing through the transistor 105 varies according to the detected ambient temperature. Accordingly, the power of the optical output 123 is controlled to be kept at a specified level independent of the ambient temperature change.

If the resistance ratio of the voltage-dividing resistors 111 and 112 is changed, the reference voltage $V_{REF}$ (i.e., an offset of a reference driving current of the laser diode 101) can be optionally adjusted.

If the resistance ratio of the resistors 108 and 116 is changed, the changing (increasing or decreasing) rate of the driving current $I_{OP}$ with respect to the ambient temperature can be optionally adjusted.

However, the conventional laser-diode driving circuit of FIG. 1 has the following problem:

FIG. 2 shows the relationship between the driving current $I_{OP}$ and the casing temperature $T_C$ of the laser diode 101. Since the ambient temperature is detected by the use of the p-n junction diode 113 alone, the temperature-dependent voltage $V_T$ produced by the diode 113 varies linearly with respect to the temperature. Therefore, the amplified output signal current of the operational amplifier 106 and therefore the driving current $I_{OP}$ also vary linearly along a straight line B as shown in FIG. 2.

On the other hand, to keep the optical output 123 of the laser diode 101 at a specified level independent of the temperature change, the driving current $I_{OP}$ needs to change exponentially with the changing ambient temperature along a curved line A as shown in FIG. 2.

Accordingly, a problem that the conventional laser-diode driving circuit of FIG. 1 does not provide the driving current $I_{OP}$ with an ideal temperature characteristic occurs. Specifically, the power of the optical output 123 will fluctuate within a comparatively wide range due to the difference between the temperature characteristics expressed by the lines A and B. This problem will become serious when the conventional laser-diode driving circuit of FIG. 1 is used in a place where the ambient temperature varies over a wide range (for example, it is installed outdoors).

Another conventional laser-diode driving circuit is disclosed in the Japanese Non-Examined Patent Publication No. 3-145171 published in June 1991. This circuit contains a current supplying element for supplying a current to a laser diode, a current detecting element for detecting the current flowing through the laser diode, and a current limiting element for limiting the current flowing through the laser diode (i.e., light intensity emitted from the laser diode) not to exceed its absolute maximum rating. As the current limiting element, a resistor with a negative temperature coefficient (i.e., a thermistor) is used.

With the conventional laser-diode driving circuit of the Japanese Non-Examined Patent Publication No. 3-145171, the output light intensity of the laser diode can be limited not to exceed its absolute maximum rating even if the ambient temperature varies. However, the light intensity or power itself cannot be stabilized independent of the ambient temperature change. As a result, the same problem as that of the conventional circuit of FIG. 1 occurs.

Still another conventional laser-diode driving circuit is disclosed in the Japanese Non-Examined Patent Publication No. 60-254783 published in December 1985, in which an improved APC loop circuit is used.

This circuit has a laser diode, a photodiode for monitoring the light output of the laser diode, an operational amplifier for amplifying an output signal current of the photodiode, and a bipolar transistor having a base connected to the operational amplifier and a collector connected to the laser diode, which form an APC loop. A resistor and a thermistor are parallel connected to an emitter of the bipolar transistor.

A pulsed input signal applied to the laser diode and a non-pulsed bias current for the laser diode are determined so that the current ratio between the two currents is kept at a specified value. Even if the optical output characteristic of the laser diode varies dependent upon the ambient temperature, the current ratio is maintained at the value by the use of the temperature dependence of the thermistor.

With the conventional laser-diode driving circuit of the Japanese Non-Examined Patent Publication No. 60-254783, since the improved APC loop circuit is used, the above problem relating to the first-bit transmission for the burst data remains.

SUMMARY OF THE INVENTION

Accordingly, an object of the present invention is to provide a laser-diode driving circuit that enables to stable the optical output of a laser diode within a wide temperature range.

Another object of the present invention is to provide a laser-diode driving circuit that can solve the above problem relating to the first-bit transmission for the burst data.

The above objects together with others not specifically mentioned will become clear to those skilled in the art from the following description.

A laser-diode driving circuit according to the present invention includes a reference voltage generator for generating a reference voltage, a control voltage generator for generating a control voltage, an amplifier for producing an amplified output signal corresponding to the difference between the reference voltage and the control voltage, and a driving current generator for generating a driving current to drive a laser diode.

The driving current generator is driven by the amplified output signal. The control voltage has a temperature coefficient or dependence approximately the same as that required for keeping an optical output of the laser diode at a specified level independent of the ambient temperature change.

With the laser-diode driving circuit according to the present invention, the control voltage has a temperature coefficient or dependence approximately the same as that required for keeping an optical output of the laser diode at a specified level independent of the ambient temperature change. Also, the driving current generator generates the driving current corresponding to the difference between the control voltage and the reference voltage. Therefore, the driving current has the same temperature dependency or coefficient as that of the control voltage.

As a result, the optical output of the laser diode can be kept at a specified level independent of the ambient temperature change. In other words, the optical output of the laser diode can be stabilized within a wide temperature range.

Further, since the driving current is adjusted by the amplified output current of the amplifier corresponding to the ambient temperature, the above problem caused by the time constant of the conventional APC loop will not occur. Consequently, the above problem relating to the first-bit transmission for the burst data can be solved.

In the laser-diode driving circuit according to the present invention, any voltage generator may be used as the reference voltage generator if it can produce a constant voltage. However, it is preferred that a resistive voltage divider is used as the reference voltage generator, because of its simple configuration.

Any voltage generator may be used as the control voltage generator if it can produce a voltage having the above-identified temperature coefficient.

In a preferred embodiment of the invention, the control voltage generator contains a resistor, a p-n-junction diode, and a thermistor. The combination of a voltage generated by the p-n junction diode and that generated by the thermistor produces the control voltage with the above-identified temperature dependence.

Any amplifier may be used as the amplifier if it can produce an amplified output signal corresponding to the difference between the reference voltage and the control voltage.

Any current generator may be used as the driving current generator if it can generate a driving current for the laser diode.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

A preferred embodiment of the present invention will be described in detail below while referring to FIGS. 3 to 5 attached.

Figure 3:
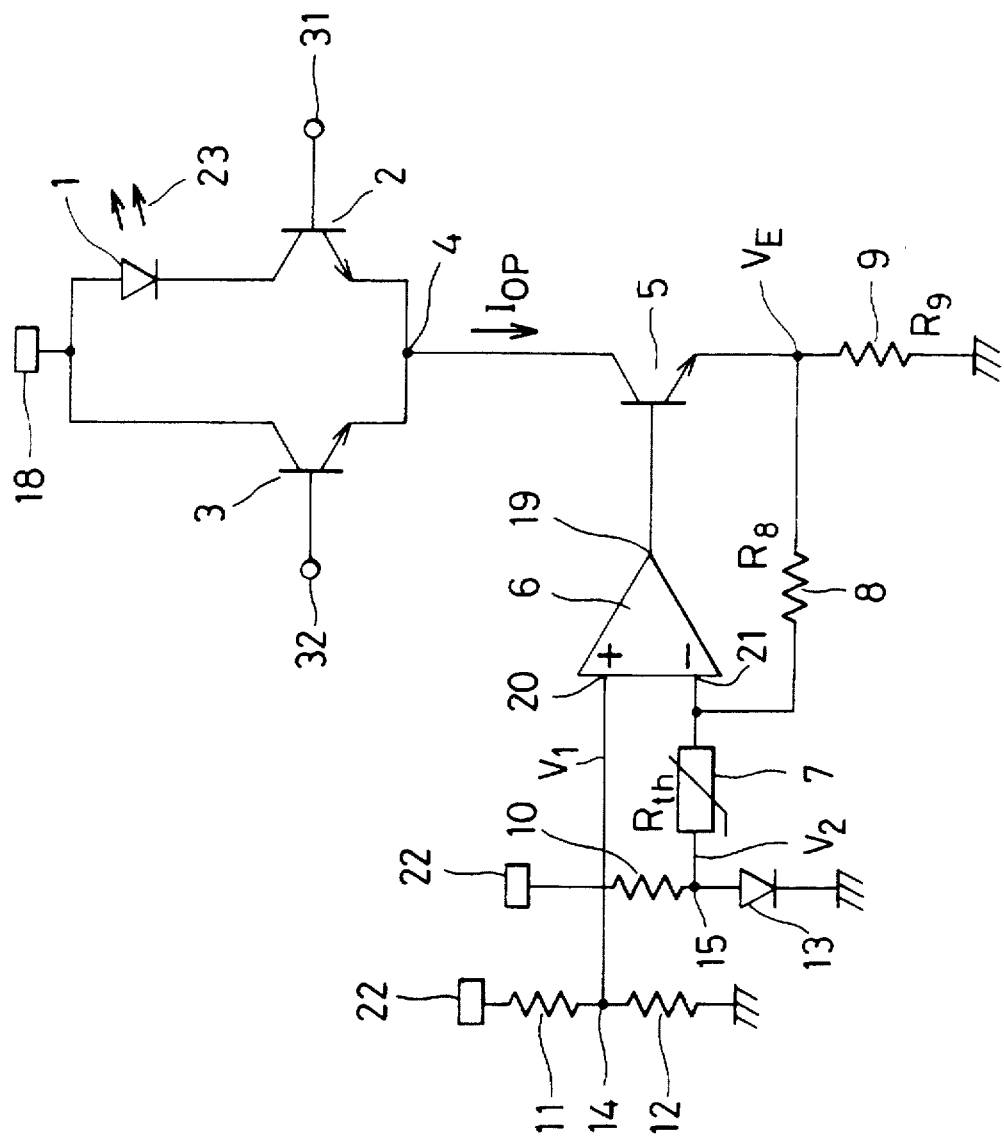
FIG. 3 is a circuit diagram of a laser-diode driving circuit according to an embodiment of the present invention.

A laser-diode driving circuit according to an embodiment of the present invention is shown in FIG. 3.

In FIG. 3, a pair of npn-bipolar transistors 2 and 3 whose emitters are coupled together constitute a differential amplifier. A base of the transistor 2 is connected to an input terminal 31 of this circuit. A base of the transistor 3 is connected to another input terminal 32 of this circuit.

A collector of the transistor 2 is connected to an anode of a laser diode 1. A cathode of the diode 2 is connected to a positive power supply 18. In other words, the collector of the transistor 2 is connected to the power supply 18 through the laser diode 1. A collector of the transistor 103 is directly connected to the power supply 18.

A pulsed input signal is differentially applied across the two input terminals 31 and 32 and then, is differentially amplified by the differential amplifier including the transistors 2 and 3. One of the transistors 2 and 3 is turned ON and the other is kept OFF according to the polarity of the applied input signal. A driving current $I_{OP}$ flows through one of the transistors 2 and 3 held in the ON state.

When the transistor 2 is in the ON state, the driving current $I_{OP}$ flows through the laser diode 1 and the transistor 2 and therefore, the laser diode 1 emits output light 23. The output light 23 has an optical intensity and a duration corresponding to those of the input signal. When the transistor 3 is in the ON state, the driving current $I_{OP}$ flows through the transistor 3 alone and therefore, no output light is emitted from the laser diode 1.

A bipolar transistor 5 has a collector connected to the coupled emitters of the transistors 2 and 3 at a connection point 4, an emitter connected to one end of a resistor (resistance: $R_0$) 9, and a base connected to an output terminal 19 of an operational amplifier 6. The other end of the resistor 9 is grounded. The transistor 5 is supplied with an amplified output signal current from the operational amplifier 6 at its base, thereby producing the driving current $I_{OP}$ for the laser diode 1 at its collector. The resistor 9 is used for degenerating the current flowing through the transistor 5.

The operational amplifier 6 has a non-inverted input terminal 20 and an inverted input terminal 21. A reference voltage $V_{REF}$ is applied to the non-inverted input terminal 20. A temperature-dependent control voltage $V_C$ is applied to the inverted input terminal 21. The operational amplifier 6 differentially amplifies the difference between the reference voltage $V_{REF}$ and the control voltage $V_C$ with a specified gain, and outputs the amplified output signal current to the base of the transistor 5. The transistor 5 is driven by the amplified output signal current, thereby generating the driving current $I_{OP}$ flowing through the transistor 5.

Two serially connected resistors 11 and 12 are provided for producing the reference voltage $V_{REF}$ between a positive power supply 22 and the ground. The reference voltage $V_{REF}$ is produced by dividing a positive supply voltage from the power supply 22 with the resistance ratio of the resistors 11 and 12 at a connection point 14 of the resistors 11 and 12. The point 14 is connected to the non-inverted input terminal 20 of the operational amplifier 6. The reference voltage $V_{REF}$ is inputted into the amplifier 6 through the non-inverted input terminal 20.

Figure 1:
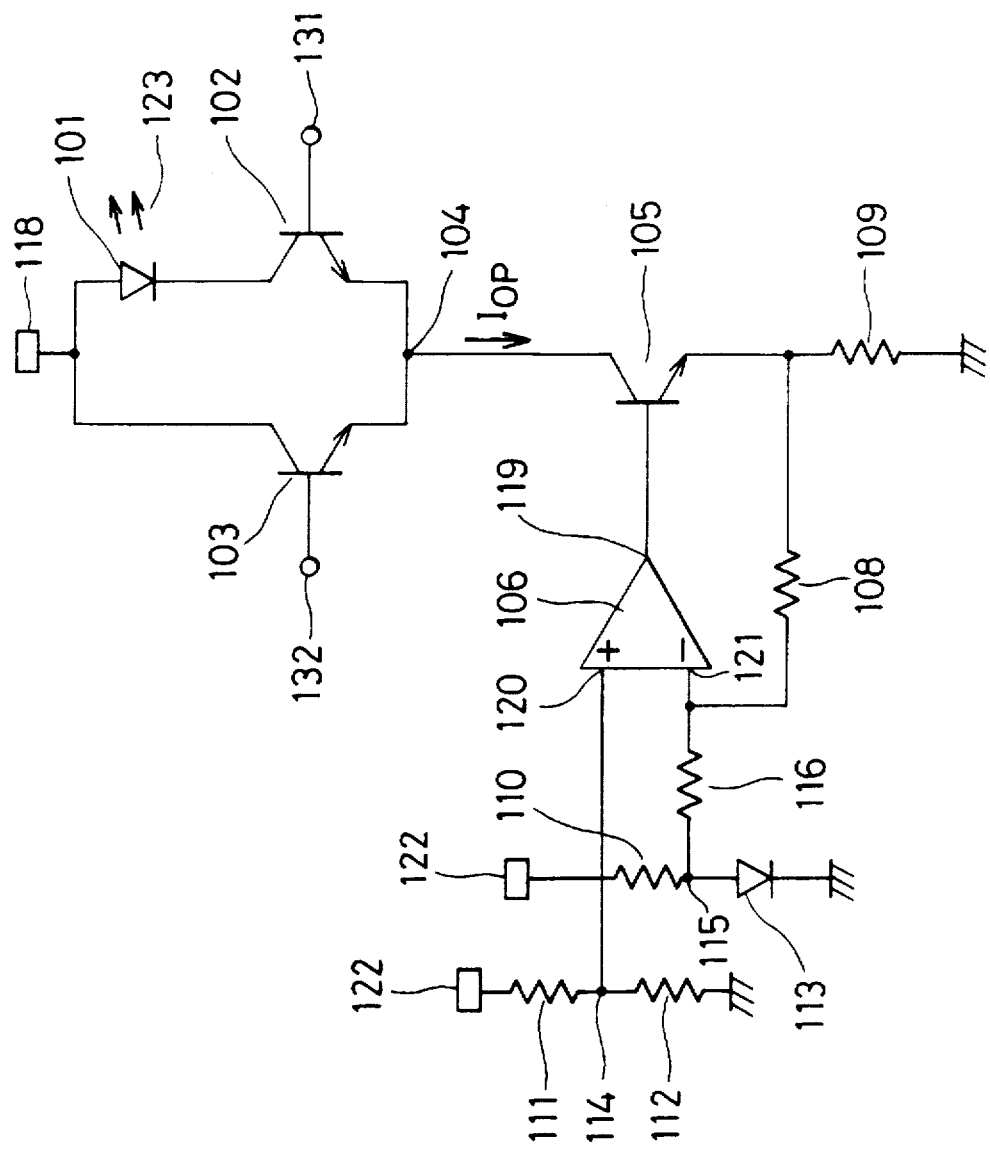
FIG. 1 is a circuit diagram of a conventional laser-diode driving circuit.
Figure 2:
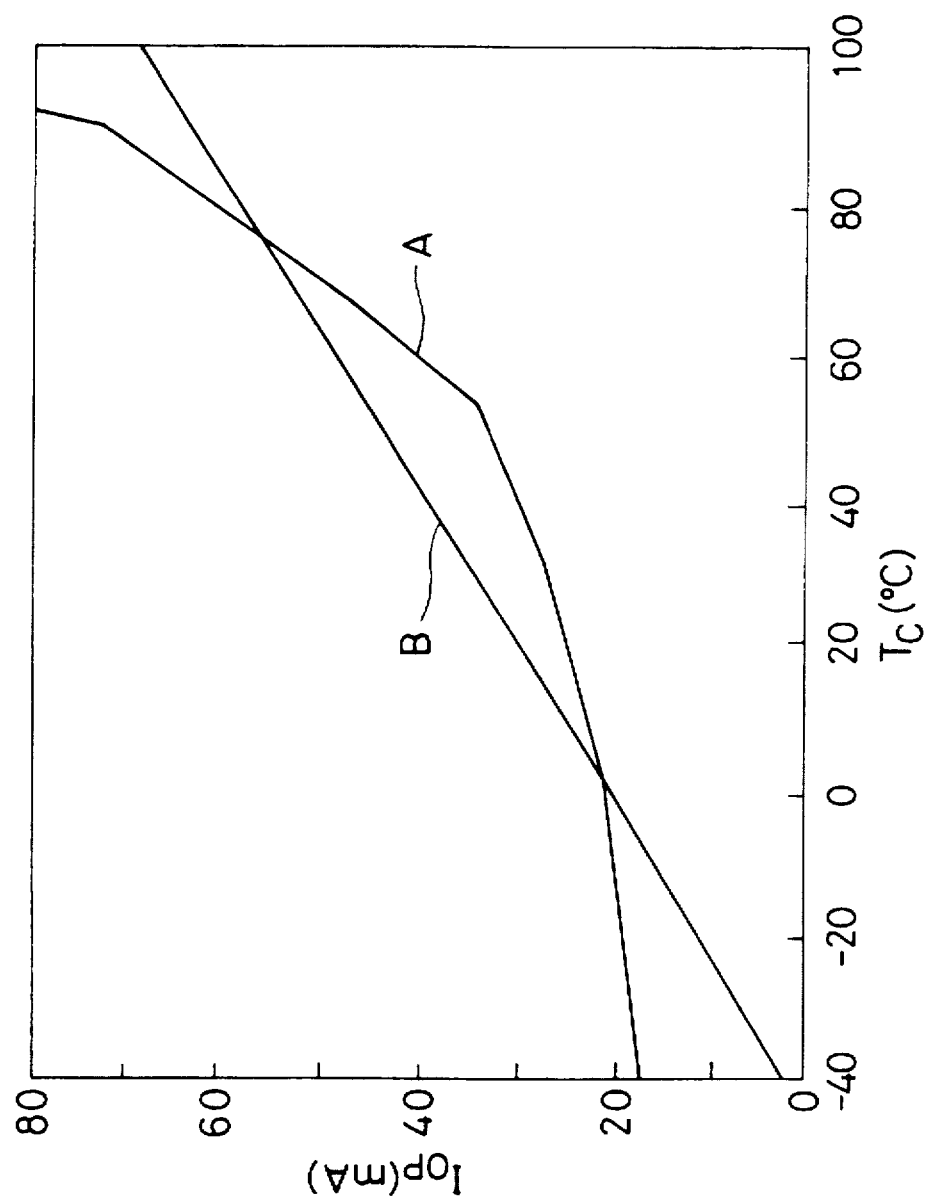
FIG. 2 is a graph showing the relationship between the driving current $I_{OP}$ and the casing temperature $T_C$ of the laser diode.

The above circuit configuration is the same as that of the conventional laser-diode driving circuit of FIG. 1.

A resistor 10 and a p-n junction diode 13 are provided for producing the temperature-dependent control voltage $V_C$ between the positive power supply 22 and the ground. The diode 13 has an anode connected to the ground and a cathode connected to one end of the resistor 10. The other end of the resistor 10 is connected to the power supply 22. A connection point 15 of the resistor 10 and the diode 13 is connected to the inverted input terminal 21 of the operational amplifier 6. The resistor 10 serves to restrict a bias current flowing through the diode 13.

A resistor (resistance: $R_8$) 8 is connected between the emitter of the transistor 5 and the inverted input terminal 21 of the amplifier 6. A part of the current flowing through the transistor 5 is fed back in negative phase to the amplifier 6 through resistor 8 and the input terminal 21 The resistor 8 serves to restrain the negative feedback current of the amplifier 6.

The temperature-dependent control voltage $V_C$ is produced by dividing the positive supply voltage of the power supply 22 with the voltage drop ratio caused by the resistor 10 and the p-n junction diode 13 at the point 15. The control voltage $V_C$ thus produced is inputted into the operational amplifier 6 through the inverted input terminal 21 and a thermistor 7 (resistance: $R_{th}$). This thermistor 7 serves not only to restrain an input current to the terminal 21 but also to compensate the temperature characteristic of the control voltage $V_C$. As a result, the compensated control voltage $V_C$ is inputted into the amplifier 6.

Next, the operation of the laser-diode driving circuit according to the invention will be explained in detail below.

The electric potential at the connection point 14 of the resistors 11 and 12 is defined as $V_1$, and the electric potential at the connection point 15 of the resistor 10, the temperature detecting diode 13, and the thermistor 7 is defined as $V_2$. Then, the potential $V_1$ is equal to the reference voltage $V_{REF}$ The potential $V_2$ has a linear temperature characteristic having a negative temperature coefficient of approximately –2 mV/deg.

The gain of the operational amplifier 6 is determined by the resistance ratio of the resistor 8 and thermistor 7, that is, ($R_8/R_{th}$). Therefore, if the electric potential at the emitter of the transistor 5 is defined as $V_E$, the potential $V_E$ has a linear temperature characteristic whose temperature coefficient is approximately equal to [2 mV/deg×($R_8/R_{th}$)].

Since the coupled emitters of the transistors 2 and 3 constituting the differential amplifier is connected to the collector of the transistor 5, the transistor 5 produces the driving current $I_{OP}$ at its collector. The potential $V_E$ at the emitter has a temperature coefficient approximately equal to [2 mV/deg×($R_8/R_{th}$)] and therefore, the driving current $I_{OP}$ also has a temperature coefficient of approximately [2 mV/deg×($R_8/R_{th}$)].

Figure 4:
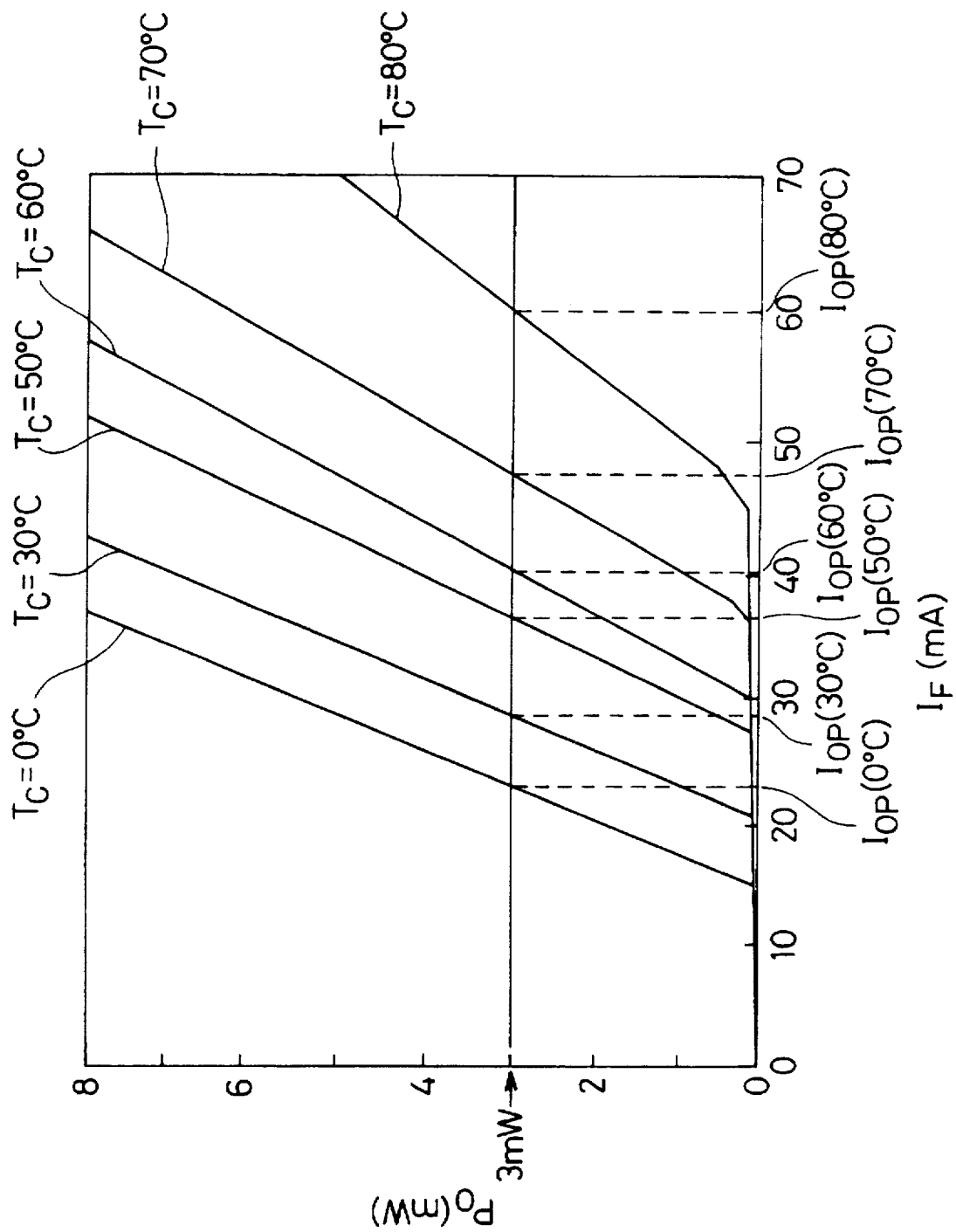
FIG. 4 is a graph showing the relationship between the optical output power $P_O$ and the forward current $I_F$ of the laser diode according to the embodiment shown in FIG. 3, in which the casing temperature $T_C$ of the laser diode is used as a parameter.

FIG. 4 shows the relationship between the optical output power $P_O$ and the forward current $I_F$ of the laser diode 1 according to the embodiment.

From FIG. 4, it is seen that the output power $P_O$ increases linearly with the increasing forward current $I_F$ when the value of the forward current $I_F$ exceeds the threshold current value, and that the slope of the curves at different values of $T_C$ varies dependent upon the casing temperature $T_c$.

Here, for example, to keep the optical output power $P_O$ at a value of 3 mW, it is understood that the value of the driving current $I_{OP}$ increases dependent upon the casing temperature $T_C$. The relationship between the driving current $I_{OP}$ and the casing temperature $T_C$ of the laser diode 1 is shown in FIG. 5.

Figure 5:
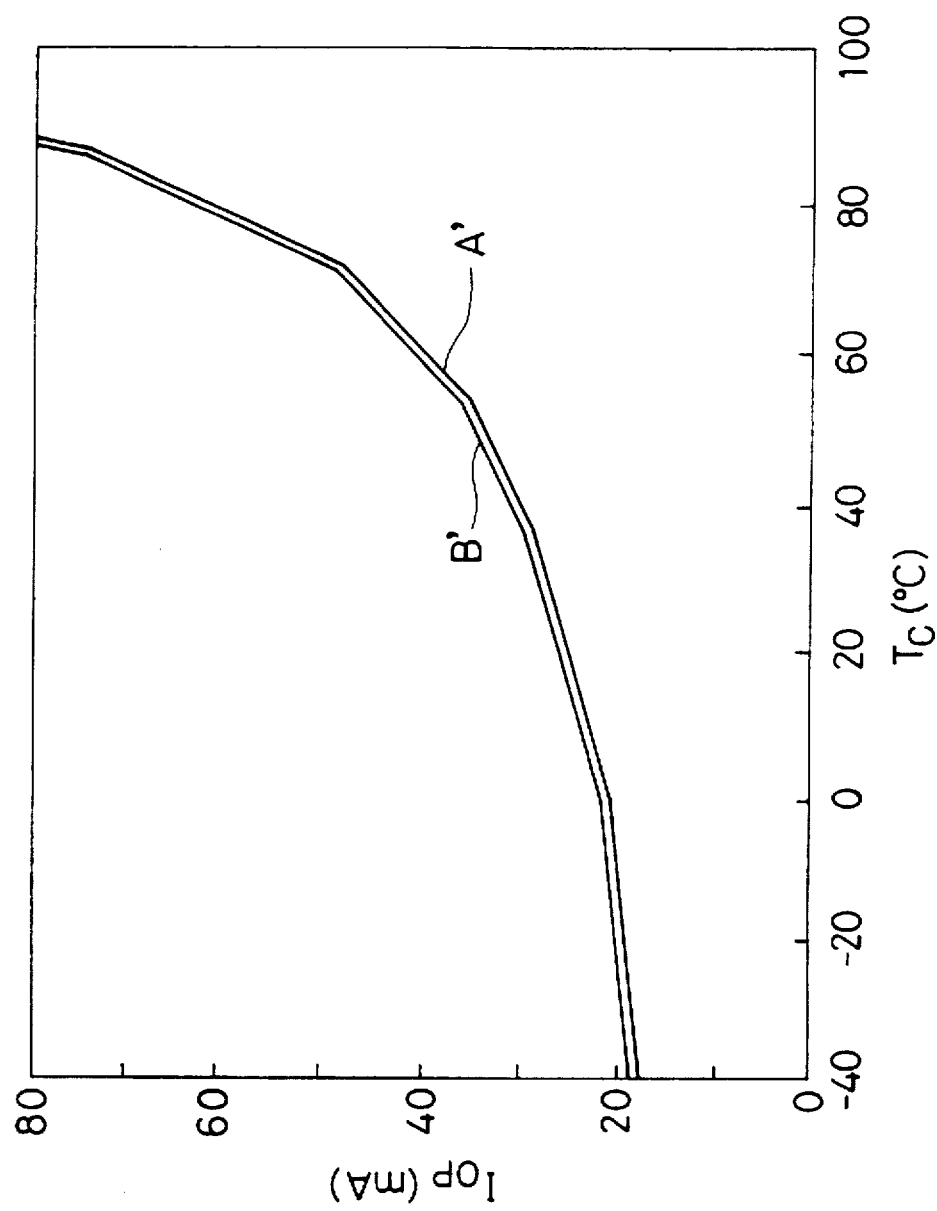
FIG. 5 is a graph showing the relationship between the driving current $I_{OP}$ and the casing temperature $T_C$ of the laser diode according to the embodiment shown in FIG. 3.

The plot A' in FIG. 5, which is obtained from the plot of $I_{OP}$ in FIG. 4, denotes the necessary temperature characteristic of the driving current $I_{OP}$. This plot A' seems to be approximately exponential, which is true because of the following reasons:

Generally, the increase of the driving or operating current of the laser diode is determined by the increase of the threshold current density $J_{th}$. When the p-n junction temperature and the characteristic temperature of the laser diode are defined as $T_j$ and $T_O$, respectively, the threshold current density $J_{th}$ can be expressed by the following equation (1):

$$J_{th} = J_{th0} \cdot \exp\left(\frac{T_j}{T_0}\right) \tag{1}$$

where $J_{th0}$ is the threshold current density at a reference temperature. The equation (1) was learned from various experience. The characteristic temperature $T_0$ is inherent in the laser diode.

In the equation (1), typically, $J_{th0}$ is set as 25° C. For example, when the laser diode has a wavelength of 1.3 μm, $T_0 \approx 70K$ for the p-n junction temperature $T_j$ ranging from 25° C. to 70° C.

Therefore, it is understood from the eqution (1) that the operataing or driving current of the laser diode 1 has an exponential temperature characteristic. Thus, the fact that the plot A' shown in FIG. 5 has an exponential temperature characteristic is confirmed.

As described above, to keep the optical output of the laser diode 1 at a specified level with high precision, the driving or operating current $I_{OP}$ of the laser diode 1 is necessary to vary along the exponential plot A' with respect to the ambient temperature. It is apparent that this is realized by giving the same exponential characteristic to the collector current of the transistor 5.

The driving current $I_{OP}$ or the collector current of the transistor 5 can be realized by the use of the thermistor 7. Specifically, the resistance $R_{th}$ of the the thermistor 7 has a negative exponential characteristic with respect to the ambient temperature, and the potential $V_2$ at the connection point 15 is compensated by the resistance $R_{th}$. Accordingly, the control voltage $V_T$ applied to the inverted terminal 21 of the operational amplifier 6 has an exponential temperature characteristic. The reason is as follows:

The emitter potenetial $V_E$ of the transistor 5 can be expressed by the following equation (2) using the potentials $V_1$ and $V_2$ at the respective connection points 14 and 15, the resistance $R_8$ of the feedback-current-limiting resistor 8, and the resistance $V_{th}$ of the thermistor 7:

$$V_E = V_1 + \frac{R_8}{R_{th}} \times (V_1 - V_2) \tag{2}$$

Therefore, the driving current $I_{OP}$ can be expressed by the following equation (3) using the resistance $R_9$ of the emitter resistor 9 of the transistor 9:

$$I_{op} = \frac{V_E}{R_9} = \frac{V_1 + \frac{R_8}{R_{th}} \times (V_1 - V_2)}{R_9} \tag{3}$$

On the other hand, the resistance $R_{th}$ of the thermistor 7 at an absolute temperature T (K) can be given by the following equation (4):

$$R_{th} = R_1 \cdot \exp\left\{ B\left(\frac{1}{T} - \frac{1}{T_1}\right) \right\} \tag{4}$$

where $R_1$ is a resistance of the thermistor 7 at a reference temperature $T_1$, and B is a constant inherent in the thermistor 7.

Substituting the equation (4) into the equation (3), it will be understood that the driving current $I_{OP}$ increases exponentially with the rising ambient temperature.

A plot B' shown in FIG. 5 indicates the temperarture characteristic of the driving current $I_{OP}$, which is obtained from the above equations (3) and (4). The plot B' gives a precision approximation of the plot A' indicating the necessary temperature dependency of the driving current $I_{OP}$ with the casing temperature $T_C$ of the laser diode 1 within a wide temperature range.

The error of the plot B' with respect to the plot A' in FIG. 5 is 1 mA or less in the range from $T_C=-40°$ C. to +90° C.

Thus, with the laser-diode driving circuit according to the embodiment, the reference voltage $V_{REF}$ is inputted into the operational amplifier 6 through its non-inverted input terminal 20 and the compensated control voltage $V_C$ having the exponential temperature characteristic is inputted into the amplifier 6 through its inverted input terminal 21. Therefore, the driving current $I_{OP}$ flowing through the transistor 5 has an exponential temperature characteristic shown by the plot B'.

As a result, the power of the optical output 23 can be kept at a specified level independent of the ambient temperature change. Further, since no APC loop circuit is used, the above problem relating to the first-bit transmission for the burst data does not occur.

In the above embodiment, the two power supplies 18 and 22 provide positive supply voltages, respectively. However, they may provide negative power supplies if the polarity of the transistors and the temperature-detecting diode is suitably changed.

Additionally, although all of the transistors are bipolar transistors in the above embodiment, any other transistor such as metal-oxide-semiconductor field-effect transistors (MOSFETs) may be used.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A laser-diode driver circuit comprising:

a reference voltage generator for generating a reference voltage;

a control voltage generator for generating a control voltage, said control voltage generator having a temperature detecting element with a p-n junction diode and a thermistor such that said control voltage has a non-linear characteristic with respect to temperature which is defined to keep an optical output of a laser diode at a specified level independent of an ambient temperature change;

an amplifier for producing an amplified output signal corresponding to the difference between said reference voltage and said control voltage; and a driving current generator for generating a driving current for driving said laser diode, said driving current generator being driven by said amplified output signal;

wherein said optical output of said laser diode is kept at said specified level independent of the ambient temperature change.

2. A laser-diode driver circuit comprising:

a reference voltage generator for generating a reference voltage:

a control voltage generator for generating a control voltage, said control voltage having a temperature dependence approximately the same as a necessary temperature dependence, said necessary temperature dependence being defined to keep an optical output of a laser diode at a specified level independent of an ambient temperature change;

an amplifier for producing an amplified output signal corresponding to the difference between said reference voltage and said control voltage; and a driving current generator for generating a driving current for driving said laser diode, said driving current generator being driven by said amplified output signal;

wherein said optical output of said laser diode is kept at said specified level independent of the ambient temperature change;

wherein said control voltage generator comprises a resistor, a p-n junction diode and a thermistor;

wherein said resistor and said p-n junction diode are used for detecting the ambient temperature to produce a temperature-dependent voltage; and wherein said thermistor is used for compensating said temperature-dependent voltage.

3. A laser-diode driving circuit as claimed in claim 1, wherein said control voltage has an exponential characteristic with respect to the ambient temperature;

and wherein the value of said control voltage increases with the rising value of said ambient temperature.

4. A laser-diode driver circuit comprising:

(a) a differential pair of first and second transistors whose emitters or sources are coupled together and whose bases or gates are differentially applied with an input signal;

a collector or drain of said first transistor being connected to a laser diode;

(b) a third transistor whose collector or drain is connected to said coupled emitters of said first and second transistors;

(c) a differential amplifier having a first input terminal to be applied with a reference voltage, a second input terminal to be applied with a control voltage, and an output terminal through which an amplified output signal is outputted;

said output terminal being connected to a base or gate of said third transistor, so that said amplified output signal is inputted into said connected base or gate of said third transistor, thereby driving said third transistor;

said third transistor producing a driving current for said laser diode at its collector or drain;

(d) a reference voltage generator for generating said reference voltage, said reference voltage being applied to said first input terminal of said differential amplifier;

(e) a control voltage generator for generating said control voltage, said control voltage being applied to said second input terminal of said differential amplifier;

said control voltage having a temperature dependence approximately the same as a necessary temperature dependence defined to keep an optical output of said laser diode at a specified level independent of the ambient temperature change;

wherein said optical output of said laser diode is kept at said specified level independent of the ambient temperature change.

5. A laser-diode driving circuit as claimed in claim 4, wherein said control voltage generator contains a resistor, a p-n junction diode and a thermistor;

and wherein said resistor and said p-n junction diode are used for detecting the ambient temperature to produce a temperature-dependent voltage;

and wherein said thermistor is used for compensating said temperature-dependent voltage to produce said control voltage.

6. A laser-diode driving circuit as claimed in claim 4, wherein said control voltage has an exponential characteristic with respect to the ambient temperature;

and wherein the value of said control voltage increases with the rising value of said ambient temperature.

7. A laser-diode driving circuit as claimed in claim 4, wherein said control voltage generator contains a resistor, a p-n junction diode and a thermistor;

and wherein said resistor and said p-n junction diode are serially connected to produce a temperature-dependent voltage at a connection point of said resistor and said p-n junction diode;

and wherein said thermistor is connected between said connection point and said second input terminal of said differential amplifier, thereby compensating said temperature-dependent voltage to produce said control voltage having an exponential characteristic with respect to the ambient temperature;

and wherein the value of said control voltage increases with the rising value of said ambient temperature.

8. A laser-diode driving circuit as claimed in claim 7, further comprising a second resistor connected between an emitter or source of said third transistor and one of said first and second input terminals of said differential amplifier;

wherein a part of a current flowing through an emitter of said third transistor is fedback to said differential amplifier in negative phase, thereby stabilizing said driving current at a specified value of said ambient temperature.

* * * * *